United States Patent [19]

Atherton et al.

[11] 4,321,491
[45] Mar. 23, 1982

[54] LEVEL SHIFT CIRCUIT

[75] Inventors: James H. Atherton, Flemington, N.J.; William C. Dreisbach, Baldwinsville, N.Y.

[73] Assignee: RCA Corporation, New York, N.Y.

[21] Appl. No.: 46,049

[22] Filed: Jun. 6, 1979

[51] Int. Cl.³ .................... H03K 5/02; H03K 19/017; H03K 19/094; H03K 3/353
[52] U.S. Cl. .................................. 307/475; 307/279; 307/446; 307/585
[58] Field of Search ............... 307/205, 208, 251, 264, 307/270, 279, DIG. 1, 475, 446, 579, 585

[56] References Cited

U.S. PATENT DOCUMENTS

| | | | |
|---|---|---|---|
| 3,676,700 | 7/1972 | Buchanan | 307/205 |
| 3,728,556 | 4/1973 | Arnell | 307/251 |
| 3,801,831 | 4/1974 | Dame | 307/251 |
| 3,808,462 | 4/1974 | Parrish et al. | 307/205 X |
| 3,823,330 | 7/1974 | Rapp | 307/205 X |
| 3,916,430 | 10/1975 | Heuner et al. | 307/DIG. 1 X |
| 3,976,984 | 8/1976 | Hirasawa | 307/DIG. 1 X |
| 4,080,539 | 3/1978 | Stewart | 307/264 |
| 4,109,163 | 8/1978 | Cricchi | 307/DIG. 1 X |
| 4,216,390 | 8/1980 | Stewart | 307/DIG. 1 X |

*Primary Examiner*—Larry N. Anagnos
*Attorney, Agent, or Firm*—Samuel Cohen; Henry I. Schanzer

[57] ABSTRACT

An inverting stage transfers binary signals from an input signal source to a latch circuit when the inverting stage and the latch are operated at similar voltages. Following data transfer, the operating voltage across the latch is increased. The inverting stage includes a diode which enables the transfer of binary signals between the inverting stage and the latch but which blocks the flow of current between them when the voltage across the latch is increased. The voltage levels of the output signals of the latch increase in correspondence with the increase in the operating voltage but the logic state to which the latch was set is maintained and there is no steady state current conduction between the inverting stage and the latch.

18 Claims, 4 Drawing Figures

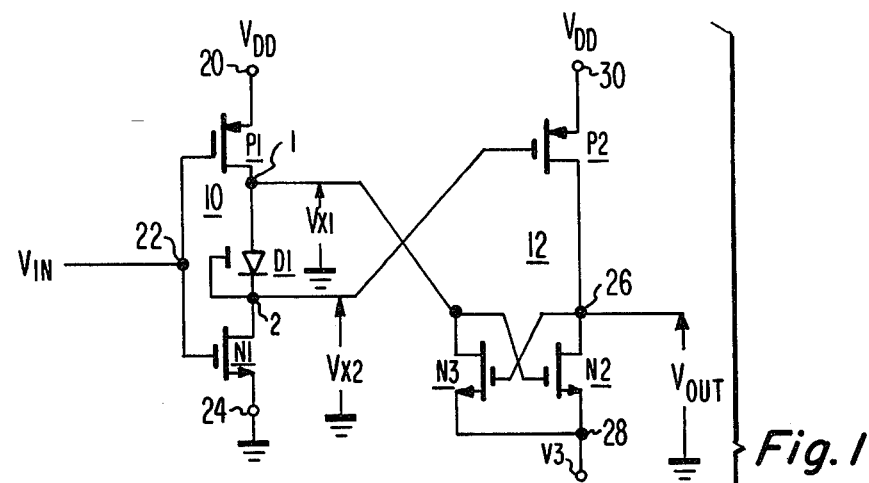
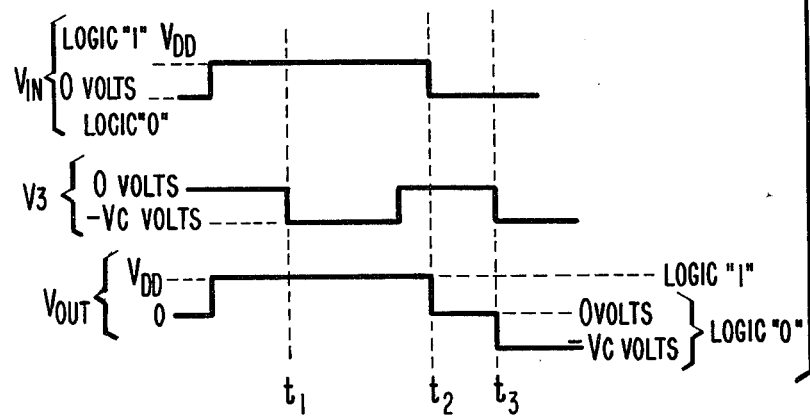
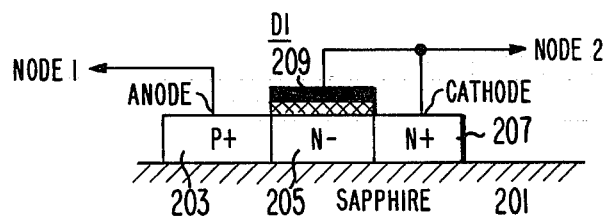
Fig. 1
Fig. 2

LEVEL SHIFT CIRCUIT

This invention relates to level shift circuits.

It is often necessary and/or desirable to operate different parts of an electronic system at different voltage levels and to couple signals from one part to another. However, the signals at the interfaces may not be compatible due to the differences in operating voltage. It is, therefore, necessary to provide a level shift circuit which can make the signals produced in one part of the system suitable for application to another part of the system. For a level shift circuit to be useful it must be compatible with the other circuits of the system with respect, among other things, to speed of operation, and minimization of power dissipation.

In circuits embodying the invention, an inverting stage transfers input signals to a full or half latch circuit. The inverting stage includes a unidirectional conducting element in its main conduction path which blocks the flow of steady-state current between the inverting stage and the latch when the operating voltage applied across the latch is outside the range of the operating voltage applied across the inverting stage.

In a preferred operating mode, data is transferred via the inverting stage to the latch when both are operated at the same or similar voltages. Following data transfer, the operating voltage across the latch is increased with the latch being maintained in the state to which it was set.

In the accompanying drawings, described below, like reference characters denote like components, enhancement mode insulated-gate field-effect transistors (IGFETs) are used to illustrate the invention, and the letters P and N identify the conductivity types of the transistors:

FIG. 1 is a schematic diagram of a level shift circuit embodying the invention;

FIG. 2 is a cross sectional diagram of a gated diode suitable for use in the circuit of FIG. 1.

Figure 4:
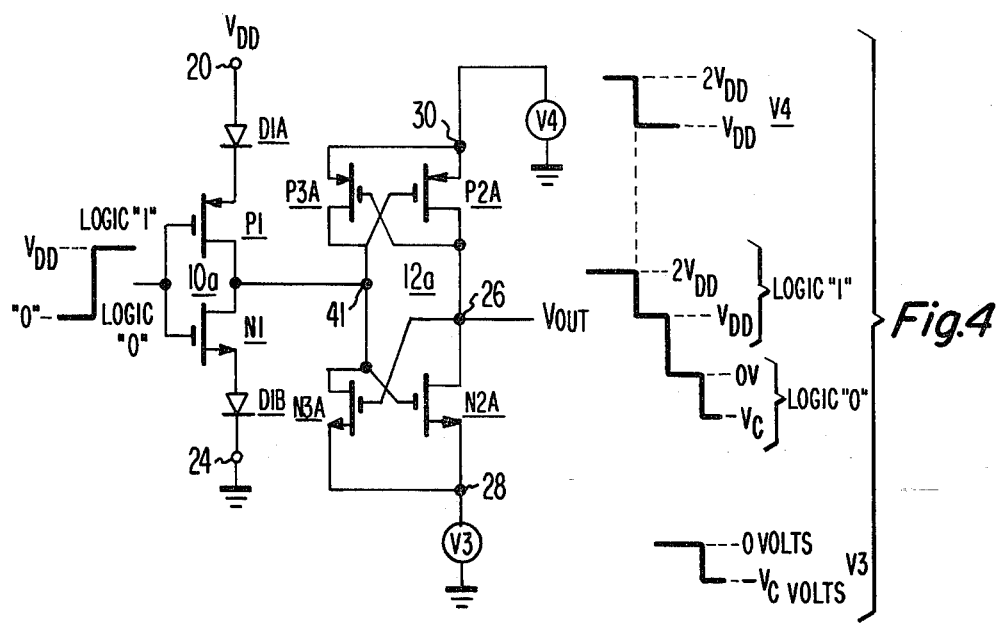
FIGS. 3 and 4 are schematic diagrams of other level shifting circuits embodying the invention.

The circuit of FIG. 1 includes an inverting stage 10 and a latch circuit 12. The inverting stage is comprised of transistors P1 and N1 and a gated diode D1. Transistor P1 is connected at its source electrode to a power terminal 20, at its gate electrode to an input terminal 22, and at its drain electrode to a node 1. Transistor N1 is connected at its source electrode to a power terminal 24, at its gate electrode to a terminal 22, and at its drain to a node 2. Diode D1 is connected at its anode to node 1 and at its cathode to node 2.

Diode D1 is a gated diode formed on a sapphire substrate 201 as shown in FIG. 2. The diode includes a P+ region 203 which defines the anode region, a region 205 of N-conductivity type, and a region 207 of N+ conductivity type which defines the cathode region. Overlying, and isolated from, the region 205 is an electrode (gate) of conductive material (e.g. polysilicon) connected to the cathode. The gated diode is preferred for use because it is characterized by a very low junction capacitance (anode to cathode). Thus, when gated diode D1 is reverse biased, there is very little capacitive loading on node 1. Gated diode D1 also has a relatively high reverse breakdown voltage ($V_R$) and very low leakage current. However, other suitable diodes could be used instead. Diode D1 blocks current flow between node 2 and node 1 when the voltage at node 1 (the drain of P1) goes negative with respect to the voltage at the drain of N1.

The latch 12 is a half-latch and includes transistors P2 and cross-coupled transistors N2 and N3. P2 is connected at its source to a terminal 30, at its gate to node 2, and at its drain to an output terminal 26. Transistor N2 is connected at its drain to terminal 26, at its source to a terminal 28 and at its gate to node 1. The source-to-drain path of transistor N3 is connected between the gate and source of transistor N2 and its gate is connected to output terminal 26. An operating voltage of $V_{DD}$ volts which, by way of example, is equal to 5 volts is applied to terminals 20 and 30. An operating voltage which, by way of example, is equal to zero volts (ground potential) is applied to terminal 24. An operating voltage $V_3$ is applied to terminal 28. $V_3$ is selectively switched from ground potential to a negative voltage of $-V_C$ volts, where $-V_C$ is, for example, $-5$ volts.

In the operation of the circuit of FIG. 1, signal transfer between inverting stage 10 and latch 12 occurs when both are operated at the same or similar potentials. That is, $V_{DD}$ volts is applied to terminals 20 and 30 and ground potential is applied to terminals 24 and 28. Following the transfer of information, the magnitude of the operating potential $V_3$ applied to terminal 28 is increased from 0 volts to $-V_C$ volts. The transfer of information (logic "0" or logic "1") from input terminal 22 to output terminal 26 is now described.

In the discussion of the circuit of FIG. 1 to follow, a voltage at, or close to, $V_{DD}$ volts to arbitrarily defined as "high" or logic "1" and a voltage at, or close to, zero volts is arbitrarily defined as "low" or logic "0". Also, any voltage more positive than $V_{DD}$ will be defined as logic "1" while any voltage below ground potential will be defined as logic "0".

An input signal ($V_{IN}$) is applied to input terminal 22 which can assume one of two levels, the first level is equal to, or close to, zero volts (i.e. logic "0") and the second level is equal to, or close to, $V_{DD}$ volts (i.e. logic "1"). The operation of the circuit of FIG. 1 will first be examined for the condition of $V_{IN}$ equal to logic "1" and then for $V_{IN}$ equal to logic "0".

When $V_{IN}$ is equal to $V_{DD}$ volts, transistor P1 is turned-off while transistor N1 is turned-on clamping the gate electrode of transistor P2 to ground potential. P2 is then turned-on coupling $V_{DD}$ volts to output terminal 26 thereby causing $V_{OUT}$ to be "high". When transistor N1 is turned-on there is conduction through its source-to-drain path discharging the capacitance at node 2 and there is conduction through diode D1 and through N1 discharging the capacitance at node 1 which, initially, may be charged to $V_{DD}$ volts. Following the turn-on of N1 and the discharge of the capacitances at nodes 1 and 2 the potential ($V_{X2}$) at the cathode of diode D1 (node 2) is at, or close to, ground potential and the potential ($V_{X1}$) at the anode of diode D1 (node 1) is approximately $V_F$ volts above ground potential, where $V_F$ is the forward voltage drop of diode D1. The value of $V_F$ varies as a function of the current through diode D1 (e.g. $V_F$ may be approximately equal to 0.8 volt for a current above 1 microampere and to be significantly less than 0.8 volt for lower values of diode currents). For the low steady state values of forward current through D1 it may be assumed that the minimum value of the threshold voltage ($V_T$) of transistor N2 is greater than the maximum $V_F$ (e.g. $V_{Tmin} = 1$ volt). Thus, when N1 is turned-on it causes the turn-off of N2 since the gate potential of N2 ($V_{X1}$) is then approximately equal to $V_F$ which is less than the $V_T$ of N2. The turn-off of N2 is ensured by the presence of transistor N3 and by the feedback of the voltage ($V_{OUT}$) at output terminal 26 to the gate electrode of N3. With P2-ON, as soon as $V_{OUT}$ is $V_T$ volts more positive than V3 (which is applied to terminal 28 and which is also the potential applied to the source electrode of N3), N3 is turned-on and provides a low impedance conduction path between the gate and source of transistor N2. The gate-to-source potential ($V_{GS}$) of N2 is close to zero volts and N2 is turned off. Thus, for $V_{IN}=V_{DD}=$High, $V_{OUT}=V_{DD}=$High; transistors N1, P2 and N3 are turned-on and transistors P1 and N2 are turned off.

It will now be shown that when the potential V3 goes from ground to $-V_C$ volts that transistor N2 remains non-conducting and that there is essentially no power dissipation in the circuit. As V3 goes to $-V_C$ volts (with $V_{IN}$ and $V_{OUT}$ equal "high") N3 with its gate at terminal 26 and its source at terminal 28 is turned on harder than before. N3 continues to provide a low impedance conduction path between the gate and source of transistor N2 and holds the $V_{GS}$ of N2 close to zero volts. Hence, N2 remains turned off. Transistors N2 and N3 are effectively cross-coupled and in a state in which N3 is conducting and clamping N2 in the off condition.

Concurrently, N1 is turned-on turning on P2 which couples $V_{DD}$ to terminal 26. Since N2 is turned off, P2 can drive $V_{OUT}$ to $V_{DD}$ volts. Thus, as shown in FIG. 1 for time when $V_{IN}$ is "high," $V_{OUT}$ also is high whether V3 is at 0 volts or at $-V_C$ volts.

At this juncture, the role of diode D1 is examined. When V3 goes to $=V_C$ volts with transistor N3 turned-on hard, the $-V_C$ volts at terminal 28 is coupled via the conduction path of transistor N3 to the anode (node 1) of diode D1. Concurrently, the cathode of diode D1 is connected via the turn-on conduction path of N1 to ground. Diode D1 is thus reversed biased and blocks current flow from grounded terminal 24 via the conduction paths of turned-on transistors N1 and N3 into terminal 28 which is now at $-V_C$ volts.

Since diode D1 has a very high impedance in the reverse direction (i.e. it is a very low leakage device) there is no low impedance path between terminals 24 and 28. Hence, there is little, if any, power dissipation. Also, since diode D1 is reverse biased, node 2 is isolated from node 1. Thus, the voltage at node 1 follows the V3 voltage transition from 0 to $-V_C$ volts while node 2 remains at, or close to, zero volts. V3 is coupled via the conduction path of N3 to node 1. The capacitance of node 1 consists primarily of the drain-to-gate capacitance ($C_{DGP1}$) of turned-off transistor P1, the anode-to-cathode capacitance of D1, and the gate-to-drain capacitance ($C_{DGN2}$) of N2. It is important to note that the drain-to-gate capacitance ($C_{DG}$) of a turned-off IGFET is much lower than the $C_{DG}$ of a conducting or a turned-on IGFET. Since P1 and N2 are turned off $C_{DGP1}$ and $C_{DGN2}$ are low and since D1 is a very low capacitance device there is very little loading on the potential source (not shown) generating the V3 volts coupled to terminal 28. D1 isolates node 1 which has low capacitance and terminal 28 from node 2 which has significantly greater capacitance due to the $C_{DG}$'s of N1 and P2 which are turned-on.

With diode D1 in the circuit, the gate of P2 can be clamped to ground via N1 while the gate of N2 can be tightly coupled to V3 volts (via N3) with little, if any, power dissipation. If diode D1 were absent from the circuit there would be a conduction path between ground at terminal 24 and $-V_C$ at terminal 28 via the conduction paths of transistors N1 and N3 resulting in substantial power dissipation. Furthermore, there would be voltage division depending on the ratio of the impedances of N1 and N3 and the turn-off of transistor N2 would no longer be certain. If N2 did not turn-off, then $V_{OUT}$ could be erroneous in that it would not be at $V_{DD}$ and, depending upon the conducting condition of N2, could be at a value representing a 0 rather than a 1, as required.

Assume now that $V_{IN}$ goes "low" and that V3 is initially also at zero volts.

For $V_{IN}$ "low" transistor P1 is turned-on and transistor N1 is turned-off. $V_{DD}$ volts are applied via the conduction path of P1 to the gate of transistor N2 turning it on and clamping $V_{OUT}$ to the voltage at terminal 28. With P1-ON and N1-OFF, node 1 is pulled up to $V_{DD}$ volts while node 2 goes to $[V_{DD}-V_F]$ volts, due to conduction through D1 which is forward biased and enables the capacitance at node 2 to be charged up to $V_{DD}-V_F$. Thus, substantially, the full $V_{DD}$ volts is applied to the gate of N2 and $[V_{DD}-V_F]$ volts is applied to the gate of P2. Assume $V_F$ is less than the $V_T$ of P2. Hence, P2 is turned-off since its $V_{GS}$ is less than its $V_T$ while N2 is turned-on hard. $V_{OUT}$ is then clamped to the zero volts at terminal 28 via the conduction path of N2 and will be at, or close to, zero volts. With $V_{OUT}$ at zero volts, the gate-to-source potential ($V_{GS}$) of N3 is equal to, or close to zero due to the clamping action of N2 and thus N3 is turned-off. Thus, for $V_{IN}=$"low" and V3="low", P1 and N2 are turned-on; N1, P2 and N3 are turned-off; and $V_{OUT}$ is "low".

It remains to be shown that, when V3 switches from zero volts to $-V_C$ volts, the voltage at the output changes level but that the logic "low" state is maintained. With $V_{IN}$ and $V_{OUT}$ "low" assume that V3 goes to $-V_C$ volts. As V3 makes the transition from 0 to $-V_C$ volts, N2 with $V_{DD}$ volts applied to its gate is turned-on harder than before and maintains a low impedance conduction path between terminals 26 and 28. Transistor N3 with its $V_{GS}$ still at, or close to, zero volts remains turned-off. With N3 turned-off, the $-V_C$ voltage at terminal 28 is coupled to terminal 26 but is not reflected back into the inverting stage since N3 is turned-off. Thus, P1 remains turned-on and N1 and P2 remain turned-off. As shown in FIG. 1 for time $t_3$, $V_{OUT}$ goes from 0 volts to $-V_C$ volts and $V_{IN}$ is low.

It has, therefore, been shown that, when similar (or the same) operating voltages are applied to the inverting stage 10 and to latch 12, a logic "0" can be transferred from the input terminal to the output terminal 26. Furthermore, when the voltage across the latch is increased it remains set to the state to which it was set, i.e. terminal 26 is set to logic "0", and no steady state current flows (except for leakage currents through N3, N1 and D1, which can be neglected).

The location of diode D1 between the drains of P1 and N1 is also significant. So placed, D1 does not affect the turn-on point of N1 or P1. That is N1 turns on when $V_{IN}$ goes $V_T$ (of N1) volts above ground and P1 turns on when $V_{IN}$ goes $V_T$ (of P1) volts below $V_{DD}$. The circuit remains fully symmetrical.

Figure 3:
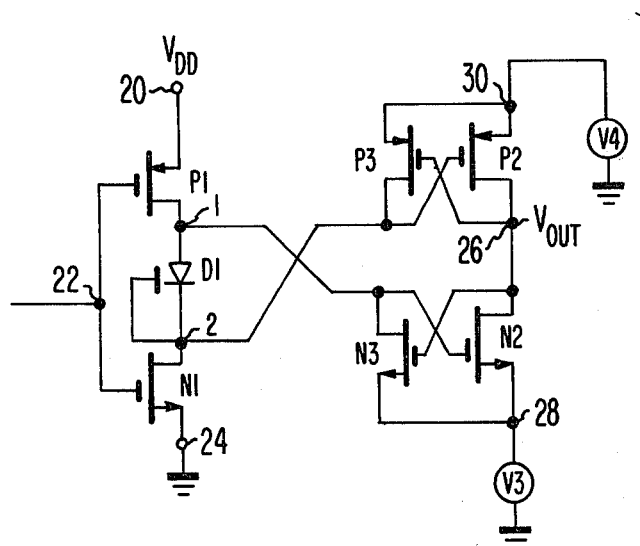
Figure 3:
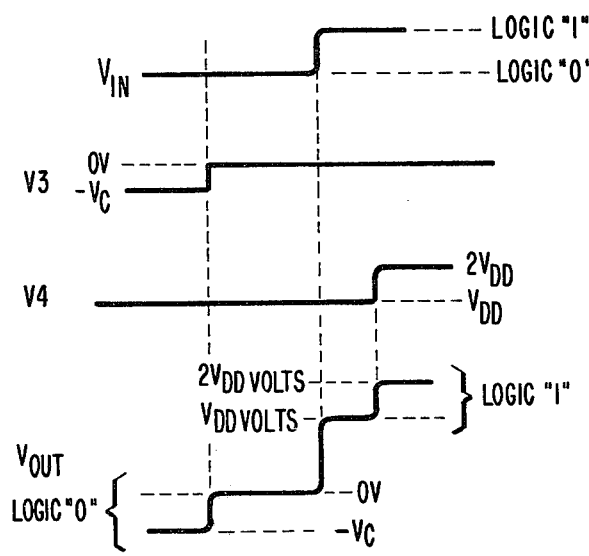

The circuit of FIG. 1 may be modified as shown in FIG. 3 to enable "up" level shifting as well as "down" level shifting.

The circuit of FIG. 3 is similar to that of FIG. 1 except that a transistor P3 has been added, and a potential V4 which can be selectively switched from $V_{DD}$ volts to $2V_{DD}$ volts is applied to power terminal 30. (The value of $2V_{DD}$ is used by way of example only, a wide range of potentials greater than $V_{DD}$ may be used). The drain-to-source path of P3 is connected between the gate and source of P2 and the gate of P3 is connected to output terminal 26, whereby P2 and P3 are cross-coupled.

The operation of the circuit of FIG. 3 is first examined for the condition when a voltage of $V_{DD}$ volts is applied to terminals 20 and 30 and ground potential is applied to terminals 24 and 28. When $V_{IN}$ is high, P1 is turned off; N1 is turned on clamping the gate of P2 to ground and the gate electrode of N2 is discharged to $V_F$ volts above ground via D1 and N1. Hence, P2 is turned on and couples the voltage at terminal 30 to output terminal 26. The voltage drop across the conduction path of P2 is very small, if anything. Hence, the $V_{GS}$ of P3 is equal to, or close to, zero volts and P3 is turned-off. For $V_{IN}$-high, as in the circuit of FIG. 1, N2 is turned-off due to the action of N3 and N1. P2 can then clamp $V_{OUT}$ to $V_{DD}$ volts ("high").

Assume now that V4 goes from $V_{DD}$ to $2V_{DD}$ volts. P2 with its gate held at ground and its source at $2V_{DD}$ conducts harder than before and couples the $2V_{DD}$ volts to output terminal 26. P3 remains cut-off since its $V_{GS}$ is still close to zero volts and N2 also remains turned-off due to the cross coupling action of N3. Thus, when $V_{IN}$ is high, $V_{OUT}$ follows the transition of V4 applied to terminal 30 from $V_{DD}$ to $2V_{DD}$ volts.

When $V_{IN}$ goes "low" with $V_{DD}$ volts applied to terminals 20 and 30 and ground applied to terminals 24 and 28, P1 turns on, turning-on N2 directly and turning off P2 via D1. The turn-on of N2 discharges $V_{OUT}$ towards ground. As soon as $V_{OUT}$ decreases below $V_{DD}$ by an amount in excess of the $V_T$ of P3, the latter turns on and its conduction path connected between the gate and source of P2 causes the $V_{GS}$ of the latter to be at, or close to, zero volts. Thus, for $V_{IN}$ "low," P1, N2 and P3 are turned on, P2 and N1 are turned off and $V_{OUT}$ is "low." When V4 is switched from $V_{DD}$ to $2V_{DD}$ volts, P3 remains conducting (P2 remains turned off) and couples the $2V_{DD}$ volts at its source to node 2 (cathode of D1). Diode D1 is now reverse biased since its anode is at a lower potential — $V_{DD}$ volts due to P1 on. D1 isolates node 2 from node 1 and prevents the $2V_{DD}$ volts from generating a current that would flow via P3-ON back through P1 into terminal 20 and the $V_{DD}$ supply. Thus, while P3 maintains P2 turned-off, conduction through its conduction path is blocked by means of D1.

For this signal condition the capacitance at node 2 is significantly lower than the capacitance at node 1. The $C_{DG}$ of N1 and P2 are low since they are OFF while the $C_{DG}$ of P1 and N2 are significantly higher since they are conducting. Hence, the low junction capacitance of D1 isolates the $2V_{DD}$ power supply from the drain of P1 and the gate of N2 (ON) and since the $C_{DG}$ of N1-OFF is very low, the loading on the V4 power supply is small. With N2-ON $V_{OUT}$ remains clamped to the potential V3 at terminal 28. It should be evident that V3 could switch to $-V_C$ volts and $V_{OUT}$ would follow. The operation of the circuit for V3 switching between ground and $-V_C$ is the same as for FIG. 1 and need not be detailed again.

Thus, in the circuit of FIG. 3, an input signal of $V_{DD}$ may be shifted "up" to $2V_{DD}$ (both representing the logic "1" condition) and an input signal of 0 volts may be shifted down to $-V_C$ volts (both representing the logic "0" condition). The shifting is accomplished without drawing steady state current and with little capacitive loading on the power supplies generating the $-V_C$ and $2V_{DD}$ operating voltages.

The location of diode D1 is again seen to be significant since just one diode is sufficient to block steady state currents and ensure low capacitive coupling for the level shift "up" and level shift "down" conditions.

The operation of the circuits of FIGS. 1 and 3 has been discussed in terms of transferring data from the inverting stage to the latch when the same operating voltages are applied to both and for then increasing the operating voltage across the latch to achieve level shifting. The circuits may, however, be operated with one fixed operating voltage (e.g. $V_{DD}$ and ground) applied to the inverting stage and another different, fixed operating voltage (e.g. $2V_{DD}$ and ground, or $V_{DD}$ and $-V_C$, or $2V_{DD}$ and $-V_C$) applied to the latch. An advantage of the switched power supply approach is that the circuit may then be manufactured (and be operable) using a broader range of different sized (length, width) transistors.

For operation using different fixed potentials, the sizes of the transistors have to be ratioed so that transistor P1, when turned-on, can overcome N3 (conducting) and drive N2 into conduction and that N1 when turned-on can overcome P3 and drive P2 into conduction. The loading of their respective latching transistors on P1 and N1 is not excessive and the design is readily realizable, although generally it requires more chip area than for the switched power supply operation.

Level shifting using diodes in the main conduction path of the input inverting stage 10a may also be achieved as shown in FIG. 4. Diodes D1A and D1B are connected in series with the conduction paths of transistors P1 and N1 between terminals 20 and 24. Diode D1A is connected between the source of P1 and terminal 20 and diode D1B is connected between the source of N1 and terminal 24. The drains of P1 and N1 are then connected in common to the input 41 of latch 12a. The input to the latch comprises the gate of P2A, N2A and the drains of P3A, N3A. Latch 12a is comprised of two cross coupled inverters. Transistors P2A and N2A form a standard complementary inverter and transistors P3A, N3A form a second complementary inverter.

Fixed operating voltages $V_{DD}$ and ground are applied to terminals 20 and 24, respectively, while potentials V3 and V4 are applied to terminals 28 and 30, respectively.

The operation of the circuit in response to an input signal $V_{IN}$ varying between $V_{DD}$ and ground is similar to that described above for FIGS. 1 and 3. However, in the circuit of FIG. 4, two diodes are required to ensure blocking of steady state currents for all signal conditions. Also the latch is now directly connected to the drains of transistors P1 and N1. Since one of these transistors is always conducting, and since the $C_{DG}$ of P2A and N2A (one of which is also always conducting) are present at node 41, the capacitance at that node and hence the loading on the $2V_{DD}$ and $-V_C$ power supplies is greater than in the previous circuits. Also, in the circuit of FIG. 4, the response of the circuit to the logic "1" and logic "0" inputs is altered by the offset of diodes D1A and D1B in the source circuits of P1 and N1.

As noted earlier, the latch can be operated with the potential applied to terminal 28 fixed at ground, or fixed at $-V_C$, or switched between ground and $-V_C$, and with the potential applied to terminal 30 fixed at $V_{DD}$, or fixed at $2V_{DD}$, or switched between $V_{DD}$ and $2V_{DD}$.

What is claimed is:

1. The combination comprising:

first, second, third, fourth, and fifth transistors, each transistor having first and second electrodes defining the ends of a conduction path and a control electrode;

a unidirectional conducting element;

first, second, third and fourth power terminals for the application thereto of first, second, third and fourth voltages, respectively, said first voltage being different than said second voltage, said third voltage being different than said fourth voltage, and at least one of said third and fourth voltages being different than said first and second voltages;

an input signal means;

and an output terminal;

means connecting the conduction paths of said first and second transistors in series with said unidirectional conducting element between said first and second power terminals;

means coupling the control electrodes of said first and second transistors to said input signal means;

means connecting the conduction path of said third transistor between said third power terminal and said output terminal;

means connecting the conduction path of said fourth transistor between said fourth power terminal and said output terminal;

direct current bidirectional conducting means directly connecting the control electrode of said third transistor to the second electrode of said first transistor via a continuously low impedance path and direct current bidirectional conducting means directly connecting the control electrode of said fourth transistor to the second electrode of said second transistor via a continuously low impedance path;

means connecting the conduction path of said fifth transistor between the control electrode of said third transistor and said third power terminal; and means connecting the control electrode of said fifth transistor to said output terminal.

2. The combination as claimed in claim 1 wherein said first and second transistors are insulated-gate field-effect transistors (IGFETs);

wherein said first electrode of said transistor is a source electrode and the second electrode is a drain electrode;

wherein said unidirectional conducting element is a diode having an anode and a cathode; and wherein said means connecting the conduction path of said first and second transistors in series with said unidirectional conducting element between said first and second power terminals includes means connecting said diode between the second electrodes of said first and second transistors, and means connecting the source of the first transistor to one of said first and second power terminals and the source of the second transistor to the other one of said first and second power terminals.

3. The combination as claimed in claim 2 wherein said second voltage is intermediate said first and third voltages; and wherein the potential differential between said third and fourth voltages is greater than the potential differential between said first and second voltages.

4. The combination as claimed in claim 3 wherein said anode of said diode is connected to the second electrode of said first transistor and the cathode of said diode is connected to the second electrode of said second transistor.

5. The combination as claimed in claim 3 wherein said anode of said diode is connected to the second electrode of said second transistor, and the cathode of said diode is connected to the second electrode of said first transistor.

6. The combination as claimed in claim 3 including means for selectively applying an input signal to said input signal means having either a first value approximately equal to one of said first and second voltages for turning-on said first transistor and turning-off said second transistor, or a second value equal to the other one of said first and second voltages for turning-off said first transistor and turning-on said second transistor.

7. The combination as claimed in claim 6 wherein said first transistor is of P-conductivity type and said second transistor is of N-conductivity type, and wherein said diode is poled to conduct conventional current from the drain of the first transistor to the drain of the second transistor.

8. The combination as claimed in claim 6 wherein said first transistor is of N-conductivity type and said second transistor is of P-conductivity type, and wherein said diode is poled to conduct conventional current from the drain of the second transistor to the drain of the first transistor.

9. The combination as claimed in claim 3 wherein said first and fourth transistors are of one conductivity type; and wherein each one of said second, third and fifth transistors is of a conductivity type opposite to said one conductivity type.

10. The combination as claimed in claim 3 further including a sixth transistor having its conduction path connected between the control electrode of said fourth transistor and said fourth power terminal and having its control electrode connected to said output terminal.

11. The combination as claimed in claim 3 wherein said diode is a gated diode.

12. The combination as claimed in claim 2 further including means for applying: (1) a first fixed voltage to said first power terminal; (2) a second fixed voltage to said second power terminal; (3) a third voltage to said third power terminal, said third voltage varying between a first value approximately equal to said second fixed voltage and a second value, wherein said second fixed voltage has a value intermediate said first fixed voltage and the second value of said third voltage; and (4) a fourth voltage to said fourth power terminal.

13. The combination as claimed in claim 1 wherein said unidirectional conducting element is connected between said second power terminal and the first electrode of said second transistor;

wherein said second voltage is intermediate said first and third voltages; and wherein the potential differential between said third and fourth voltages is greater than the potential differential between said first and second voltages.

14. The combination as claimed in claim 1 wherein said unidirectional element includes two diodes, one diode being connected between the first electrode of said first transistor and said first power terminal and the other diode being connected between the first electrode of the second transistor and said second power terminal; and further including a sixth transistor having its conduction path connected between the control electrode of said fourth transistor and said fourth power terminal and having its control electrode connected to said output terminal.

15. A level shift circuit comprising:
first, second, third, fourth, and fifth transistors, each transistor having first and second electrodes defining the ends of a conduction path and a control electrode;
an unidirectional conduction element;
first, second, third, and fourth power terminals for the application thereto of first, second, third, and fourth voltages, respectively, said first voltage being different than said second voltage, said third voltage being different than said fourth voltage, and at least one of said third and fourth voltages being different than said first and second voltages;
an input signal means;
and an output terminal;
means connecting the conduction paths of said first and second transistors in series with said unidirectional conducting element between said first and second power terminals;
means coupling the control electrodes of said first and second transistors to said input signal means;
means connecting the conduction path of said third transistor between said third power terminal and said output terminal;
means connecting the conduction path of said fourth transistor between said fourth power terminal and said output terminal;
bidirectional conducting means exhibiting a relatively low impedance in both directions of conduction directly connecting the control electrode of said third transistor to the second electrode of said first transistor for turning-on said third transistor and clamping the output terminal to said third power terminal when said first transistor is turned-on;
bidirectional conducting means exhibiting a relatively low impedance in both directions of conduction directly connecting the control electrode of said fourth transistor to the second electrode of said second transistor for turning-on said fourth transistor and clamping the output terminal to said fourth power terminal when said second transistor is turned-on;
means cross-coupling the third and fourth transistors, whereby the conduction path of the fifth transistor is connected between the control electrode of the third transistor and said third power terminal and the control electrode of the fifth transistor is connected to said output terminal, for clamping the control electrode of said third transistor to said third power terminal when said fifth transistor is turned on; and said unidirectional conducting element being poled in a direction to block the flow of conventional current via the conduction paths of said second and fifth transistors when the voltage applied to said second power terminal is intermediate the voltage applied to said first and third power terminals and said fifth transistor is turned-on.

16. The level shift circuit as claimed in claim 15 wherein said fourth voltage is the same as said first voltage.

17. The level shift circuit as claimed in claim 15 wherein said unidirectional conducting element is a gated diode.

18. The combination comprising:
first, second, third, fourth, and fifth transistors, each transistor having first and second electrodes defining the ends of a conduction path and a control electrode;
a unidirectional conducting element having two terminals;
first, second, third and fourth power terminals;
an input signal means;
and an output terminal;
means connecting the conduction path of said first transistor between one of said first and second power terminals and one terminal of said unidirectional conducting element;
means connecting the conduction path of said second transistor between the other terminal of said unidirectional conducting element and the other one of said first and second power terminals;
means coupling the control electrodes of said first and second transistors to said input signal means;
means connecting the conduction path of said third transistor between said third power terminal and said output terminal;
means connecting the conduction path of said fourth transistor between said fourth power terminal and said output terminal;
means connecting the conduction path of said fifth transistor between the control electrode of said third transistor and said third power terminal;
means connecting the control electrode of said fifth transistor to said output terminal;
means connecting the control electrode of said third transistor to the second electrode of said first transistor via a first relatively low impedance conduction path; and
means connecting the control electrode of said fourth transistor and one end of the conduction path of said fifth transistor to the second electrode of said second transistor via a second relatively low impedance conduction path separate and independent of said first conduction path.

* * * * *